US007876545B2

(12) United States Patent
Lenz et al.

(10) Patent No.: US 7,876,545 B2
(45) Date of Patent: Jan. 25, 2011

(54) PROTECTION ARRANGEMENT FOR PROTECTING A POWER SEMICONDUCTOR COMPONENT AGAINST OVERCURRENT AND OVERTEMPERATURE

(75) Inventors: Michael Lenz, Zorneding (DE);
Ricardo Erckert, Bad Aibling (DE);
Gerrit Utz, Wartenberg (DE)

(73) Assignee: Infineon Technologies AG, Neubiberg (DE)

( * ) Notice: Subject to any disclaimer, the term of this patent is extended or adjusted under 35 U.S.C. 154(b) by 606 days.

(21) Appl. No.: 11/395,104

(22) Filed: Mar. 31, 2006

(65) Prior Publication Data
US 2006/0279894 A1  Dec. 14, 2006

(30) Foreign Application Priority Data
Mar. 31, 2005  (DE)  ........................ 10 2005 014 725

(51) Int. Cl.
*H02H 5/04* (2006.01)
(52) U.S. Cl. ........................ 361/103; 361/93.8; 361/93.9
(58) Field of Classification Search ................. 361/103, 361/93.8, 93.9
See application file for complete search history.

(56) References Cited
U.S. PATENT DOCUMENTS

| | | | | |
|---|---|---|---|---|
| 4,507,542 A * | 3/1985 | Kunz et al. | ............ | 219/130.51 |
| 4,567,353 A * | 1/1986 | Aiba | ............ | 219/501 |
| 4,591,743 A * | 5/1986 | Kung | ............ | 327/513 |
| 4,972,136 A * | 11/1990 | Banura | ............ | 323/275 |
| 5,428,287 A * | 6/1995 | Agiman | ............ | 323/284 |
| 6,145,098 A * | 11/2000 | Nouri et al. | ............ | 714/31 |
| 2004/0043565 A1* | 3/2004 | Yamaguchi et al. | ............ | 438/268 |
| 2004/0085698 A1* | 5/2004 | Ball et al. | ............ | 361/100 |
| 2004/0120382 A1* | 6/2004 | Bennett et al. | ............ | 374/45 |
| 2004/0156154 A1* | 8/2004 | Lazarovich et al. | ............ | 361/42 |

OTHER PUBLICATIONS

"AND8140/D: Smart HotPlug Current Limit Function"; ON Semiconductor; Nov. 2004—Rev. I.*
"NIS5101: Smart Hotplug IC/Inrush Limiter/Circuit Breaker"; ON Semiconductor; Feb. 2005—Rev. 15.*

* cited by examiner

*Primary Examiner*—Jared J Fureman
*Assistant Examiner*—Nicholas Ieva
(74) *Attorney, Agent, or Firm*—Dicke, Billing & Czaja, PLLC

(57) ABSTRACT

A protection arrangement for a power semiconductor component made of a plurality of cells, in which a current sensor made of a current sense transistor and current sense resistors and also a temperature sensor, is disclosed. The current sense transistor and the temperature sensor are provided in a gap or in different gaps between the cells, while the current sense resistor is fitted directly on at least one cell. The temperature sensor may, include a plurality of stages which are located from the center of the power semiconductor component to an edge of the latter in the gap between two cells.

20 Claims, 2 Drawing Sheets

PROTECTION ARRANGEMENT FOR PROTECTING A POWER SEMICONDUCTOR COMPONENT AGAINST OVERCURRENT AND OVERTEMPERATURE

CROSS-REFERENCE TO RELATED APPLICATIONS

This Utility Patent Application claims priority to German Patent Application No. DE 10 2005 014 725.9, filed on Mar. 31, 2005, which is incorporated herein by reference.

FIELD OF INVENTION

The present invention relates to a protection arrangement for protecting a power semiconductor component having at least two or a plurality of cells against overcurrent and overtemperature, including a current sensor made of a current sense transistor and a sense resistor device lying in the source line of the sense transistor, and a temperature sensor. A plurality of cells are to be understood to be at least two cells. Purely by way of example, there may be three cells.

BACKGROUND

As is known, in numerous applications, power semiconductor components have to be protected against overcurrent and overtemperature and also, if appropriate, against overvoltage in order to prevent their destruction due to a breakdown. A current sensor, a temperature sensor, if appropriate a voltage sensor and a drive circuit are thus required to realize such a protection arrangement.

FIG. 1 illustrates a conventional protection arrangement. A voltage sensor 1, a temperature sensor 2 and a current sensor 3 are connected to a drive circuit 4, which, for its part, is connected to a power semiconductor component 5 to be protected. The voltage sensor 1 determines the voltage occurring at the power semiconductor component 5, while the temperature sensor 2 ascertains as far as possible the maximum temperature of the power semiconductor component 5 and the current sensor 3 serves for measuring the current sent through the power semiconductor component 5. The output signals of the sensors 1 to 3 are evaluated by the drive circuit 4 in order, in the event of specific limits being exceeded, to effect a turn-off of the power semiconductor component 5 or a power limiting through analog control, so that said component is prevented from being destroyed.

Specifically, the interaction of the three sensors 1 to 3 in terms of the temporal profile is of great importance in order to be able to reliably protect the power semiconductor component 5 during all conceivable thermodynamic processes.

In order to reliably avoid destruction of the power semiconductor component, it is necessary for said power semiconductor component to be operated in the so-called "safe operation area" (SOA) theoretically at any time, that is to say in particular also during fast dynamic processes.

Said SOA will be explained in more detail below with reference to FIG. 2. FIG. 2 illustrates the current i through a power semiconductor component as a function of the voltage U across said component.

In a range a of low voltages such as occur for example between drain and source of a transistor, the SOA is generally limited by the maximum current which the bonding of the housing of the component withstands. At medium voltages in a range b, primarily the temperature prevailing in the power semiconductor component is the limiting factor, the power, that is to say the product of current and voltage, being virtually constant here, so that the thermal resistance in the power semiconductor component is relevant. As the voltage rises further in a range c, it is necessary, finally, for the power to be reduced and ultimately to be brought to zero in order to prevent breakdowns.

The thermal properties have to be taken especially into account in a dynamic consideration of the power semiconductor component. That is to say that the SOA boundary line therefore has to be shifted dynamically to lower values by a protection arrangement as the temperature rises in the region of the power semiconductor component. In other words, as the temperature T rises, the SOA boundary line undergoes transition from a profile A to a profile B and further to a profile C. Correspondingly, the boundaries between the ranges a, b and c may also change slightly.

In practice, problems often arise, then, with regard to reliably detecting and correctly combining the input variables that are essential for the SOA definition, current (range a), temperature (range b), voltage (range c) and —in a dynamic consideration—time. In particular, it is difficult, in the case of high power densities and fast changes in the power loss in a power semiconductor component, to detect the peak temperature thereof, which is often given by the actual chip temperature. Moreover, it is possible only with difficulty to dynamically precisely measure the total current through the power semiconductor component. Furthermore, with the present-day conventional arrangements, it is not possible to monitor at any time the precise power distribution in a power semiconductor component, in particular power transistor, comprising numerous cells in order to avoid instances of local overheating, so-called "hot spots," which would otherwise lead to direct destruction of the relevant cells.

Current sense devices have hitherto preferably been realized from sense resistors through which flows the total current which is also passed through the power semiconductor component. However, thought has also already been given, for example in the case of a MOS power transistor as power semiconductor component, to designing specific parts, that is to say individual cells, as sense cells and to preferably constructing a current mirror circuit from said cells, which current mirror circuit then determines the current flowing through these sense cells as a measure of the total current. In the case of such solutions, however, it has been shown that the accuracy with which such current sense devices measure the current through a power semiconductor component may be unsatisfactory. Moreover, the temperature behavior is not uncritical here since such individual cells are not reliable for the determination of "hot spots." This holds true particularly at high voltages and high power densities since the temperature gradients are then large. Modern MOS transistors tend toward the formation of "hot spots" particularly in the limited state.

Similar observations may also be made for voltage sense devices.

Existing protection arrangements have temperature measuring devices for example in the form of additional chips or corresponding sensors applied on the chip of the power semiconductor component. It is thus possible, by way of example, to provide temperature sense transistors in the vicinity of a power transistor as power semiconductor component.

In order, then, to be able to detect a peak temperature as well as possible, a sense transistor should, for example, be moved into a power transistor. An optimum solution here would be one in which each cell of a power transistor is assigned an integrated sense transistor as temperature protection. By correspondingly dividing a power transistor into numerous cells and inserting sensors into these cells, it is thus possible to provide a protection arrangement that operates very well.

In the case of an excessively high rise in the temperature in the cells of a power transistor, care must be taken, moreover, to ensure that the power which is consumed in the power semiconductor component is dynamically regulated back in order thus to prevent the power semiconductor component from being destroyed.

Overall, therefore, a protection arrangement for a power semiconductor component comprising at least two cells has not been disclosed hitherto which is able reliably and with low outlay to establish operation safely in the SOA in order thus to prevent the power semiconductor component from being destroyed by local overheating. This holds true in particular for power semiconductor components used as output stages. Therefore, in order to ensure safe operation, such output stages and generally power semiconductor components are often derated.

For these and other reasons, there is a need for the present invention.

SUMMARY

The present invention provides a protection arrangement for a power semiconductor component made of a plurality of cells, including a current sensor made of a current sense transistor and current sense resistors and also a temperature sensor. The current sense transistor and the temperature sensor are provided in a gap or in different gaps between the cells, while the current sense resistor is fitted directly on at least one cell. The temperature sensor may, include a plurality of stages which are located from the center of the power semiconductor component to an edge of the latter in the gap between two cells.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

The invention is explained in more detail below with reference to the drawings, in which.

DETAILED DESCRIPTION

Figure 1:
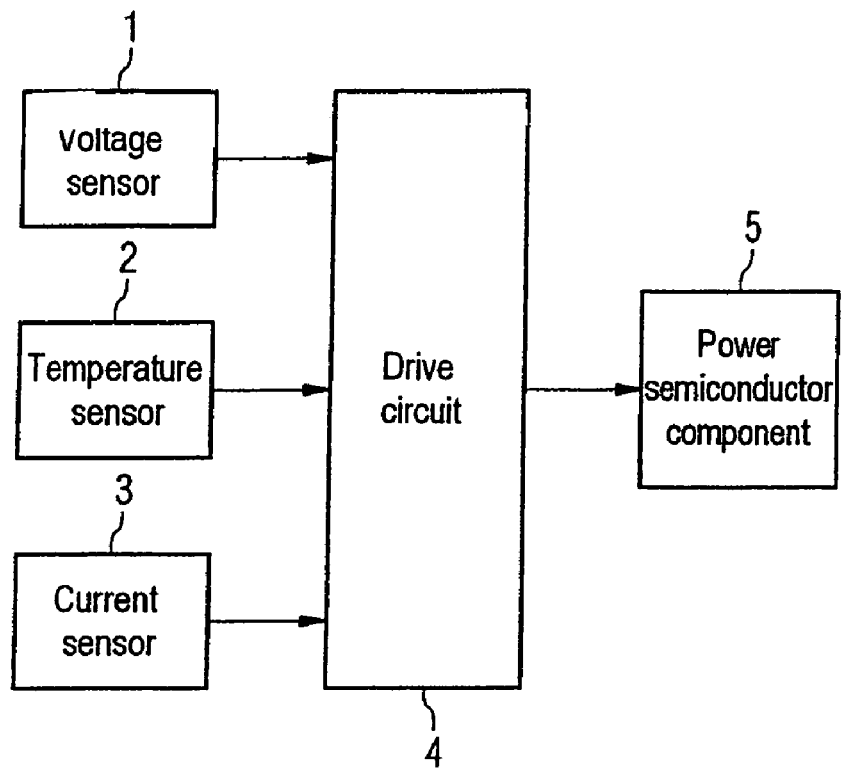
FIG. 1 illustrates a block diagram of a conventional protection arrangement.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

The present invention provides a protection arrangement for a power semiconductor component having at least two cells which reliably ensures operation of the power semiconductor component in the SOA and thus prevents the power semiconductor component from being destroyed by overheating.

In one embodiment in the case of a protection arrangement of the type mentioned in the introduction, the sense transistor is provided between a first cell and a second cell, the sense resistor device has at least one sense resistor fitted on a cell, and the temperature sensor is inserted either likewise between the first cell and the second cell or else between the second cell and a third cell or between two further cells.

In this case, the temperature sensor preferably includes a plurality of stages which are in each case fitted at locations having different temperatures.

The protection arrangement according to the invention makes it possible to safely prevent a local overheating of a power semiconductor component, such as a power transistor, for example. An effective utilization of the available area of the power semiconductor component is afforded in this case. A monolithic integration of sensors and cells of the power semiconductor component is possible.

To summarize, in the case of the protection arrangement according to the invention, the power semiconductor component, which forms an output stage, for example, is thus divided into at least two parts, so that at least two cells of the power semiconductor component, in particular of the power transistor, are present. The sense transistor of the current sensor is then introduced between said cells, that is to say—for example in the case of a three-cell embodiment—between the first cell and the second cell. Furthermore, the temperature sensor is provided between two cells, for example between the second cell and the third cell in the case of the three-cell embodiment. For the staggered indication of different temperature levels, the temperature sensor, in one advantageous development of the invention, may in this case comprise a plurality of stages which are in each case fitted at locations having different temperatures.

Generally, the sense transistor of the current sensor and the temperature sensor may be provided between the same cells, which holds true in particular for the two-cell embodiment, or between different cells, which holds true in particular for the embodiment with three cells or more.

In addition to the above measures, what is of particular importance about the protection arrangement according to the invention is that the sense resistor of the current sensor is arranged directly above the particularly jeopardized structures of the power semiconductor component. The temperature coefficient of the current sensor is thus directly influenced by the peak chip temperature of the individual cells. It may suffice, if appropriate, also to provide only one current sense resistor.

As a result of the subdivision of the power semiconductor arrangement, the protection arrangement may advantageously be provided between individual cells of the power semiconductor component. If the power semiconductor component comprises a power transistor, for example, then partial transistors whose gate-drain and source terminals are in each case connected in parallel are provided as individual cells. One driver circuit is thus sufficient for these partial transistors.

Another development of the invention provides for the sense resistor, which is preferably inserted into the source line of the sense transistor, to have a positive temperature coefficient. The voltage drop across the sense resistor then serves for current limiting for regulating the gate-source voltage and thus the drain currents of the individual partial transistors of the power transistor forming the power semiconductor component.

The sense resistor is fitted directly above the individual cells of the power semiconductor component by means of a suitable process. This position of the sense resistor ensures that the thermodynamic regulating behavior of the protection arrangement proves to be reliable.

By way of example, the sense resistor may be realized in a wiring plane that is different from the power wiring plane. The sheet resistance (resistance per square) may then be set relatively high for the sense resistor, so that small structure widths are possible. It is thus possible to realize relatively high-resistance structures of the sense resistor in conjunction with an optimum position.

An example of a suitable material that may be used for the sense resistor is aluminum, whereby the positive temperature coefficient is afforded.

The sense resistor can optimally sense the temperature of a potentially jeopardized cell of the power semiconductor component since it is fitted directly above the individual cells.

Figure 2:
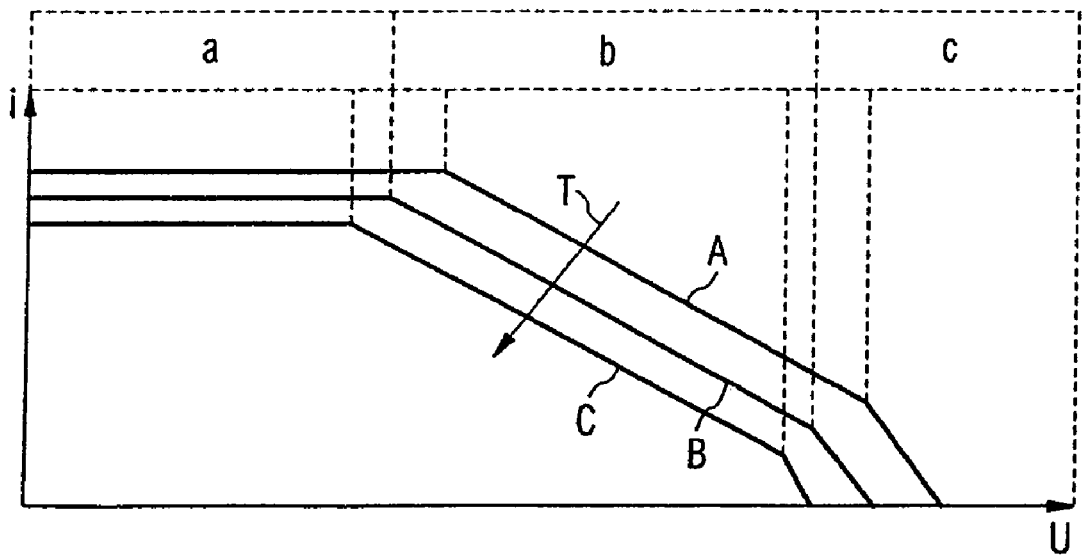
FIG. 2 illustrates schematically the SOA in the case of a power semiconductor component.

FIGS. 1 and 2 have already been explained in the introduction. In the figures, the same reference symbols are used in each case for mutually corresponding structural parts.

In the case of the protection arrangement according to the invention, particular importance is attached to the temperature sensor and the current sensor, which in this case as well—as is shown in FIG. 1—are connected to a drive circuit for the power semiconductor component. A voltage sensor that is likewise present, if appropriate, is then connected to the drive circuit in the manner shown in FIG. 1. A voltage sensor will expediently be provided in the protection arrangement wherever the power semiconductor component is also operated in the boundary range between regions b and c (cf. FIG. 2).

Therefore, the text below explains especially how, in the case of the protection arrangement according to the invention, the temperature sensor 2 and the current sensor 3 are arranged in the power semiconductor component.

Figure 3:
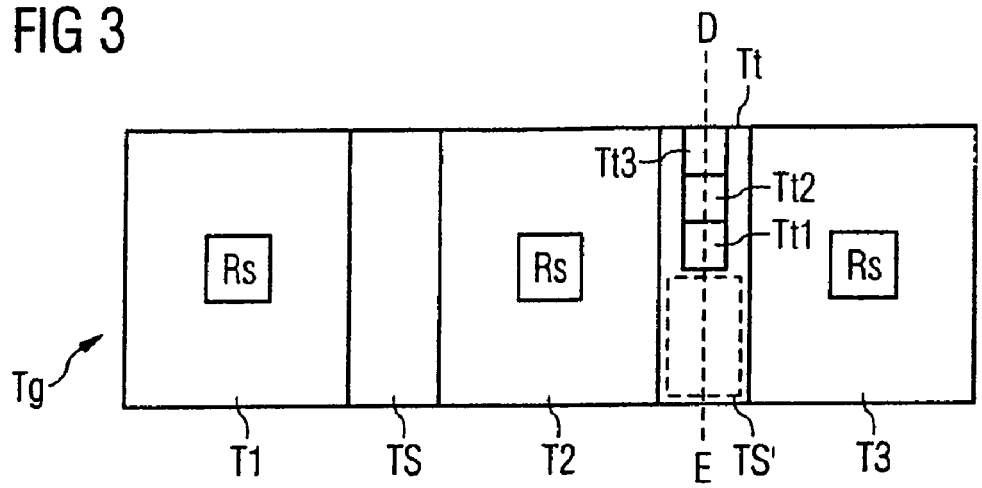
FIG. 3 illustrates a schematic plan view of an exemplary embodiment of the invention.

Firstly, FIG. 3 illustrates a plan view of a power transistor Tg made of three transistor cells T1, T2, T3 as an example of a power semiconductor component in an output stage. The cells or partial transistors T1, T2 and T3 are connected up to one another in a customary manner. That is to say that the source terminals, drain terminals and gate terminals of the cells T1, T2 and T3 are in each case connected in parallel to one another. The source of the transistor cell T1 is thus connected to the source of the transistor cell T2 and the source of the transistor cell T3. The same applies to the drain and gate of these transistor cells.

It should be noted that in the case of the protection arrangement according to the invention, it is also possible, of course, for more than two or three cells to be connected to one another. Therefore, the invention is in no way restricted to a protection arrangement having only two or three cells. Rather, it is also possible, for example, to provide four, five or more cells. In this case, if appropriate a plurality of current sensors and temperature sensors are then provided between the individual cells.

The embodiment with only two cells—for example the cell T1 is then absent—constitutes the least expensive solution, but also the solution with the lowest performance. The reason for this is the wider interspace between the two cells that is required to accommodate both sensors for current and temperature there. In order to avoid this wider interspace, it would also be possible to design the sense transistor of the current sensor over half the width and to utilize the remaining space for the temperature sensor.

In the exemplary embodiment of FIG. 3 with three cells T1, T2 and T3, then, according to the invention a current sense transistor Ts is inserted in full width in the gap between the transistor cell T1 and the transistor cell T2. In this way, it is possible largely to avoid a current transformation error as a result of different temperatures in the gap.

It has been shown that an appreciable deviation between the current measured by the current sense transistor Ts and the actual current through the power semiconductor component, that is to say a measurement error of the total current, occurs only at very high pulse powers of the power semiconductor component. In order, however, that protection is afforded by the protection arrangement even in that case, the temperature coefficient of the current limiting must be influenced by the chip temperature of the jeopardized cells themselves.

For this purpose, a resistor Rs having a positive temperature coefficient is inserted into the source line of the sense transistor Ts. The voltage drop across said resistor Rs serves for current limiting for regulating the gate-source voltage and thus the drain currents of the individual transistor cells T1, T2, T3. This current sense resistor Rs may be fitted directly above the individual cells T1, T2 and T3 by means of a suitable process.

In numerous applications, it may suffice for only one transistor cell, that is to say the cell T1 or the cell T2 or the cell T3, to be provided with a current sense resistor Rs. In any event, the thermodynamic regulating behavior of the entire power semiconductor component Tg can be set or optimized by means of the position and the local extent of the current sense resistor Rs.

Figure 5:
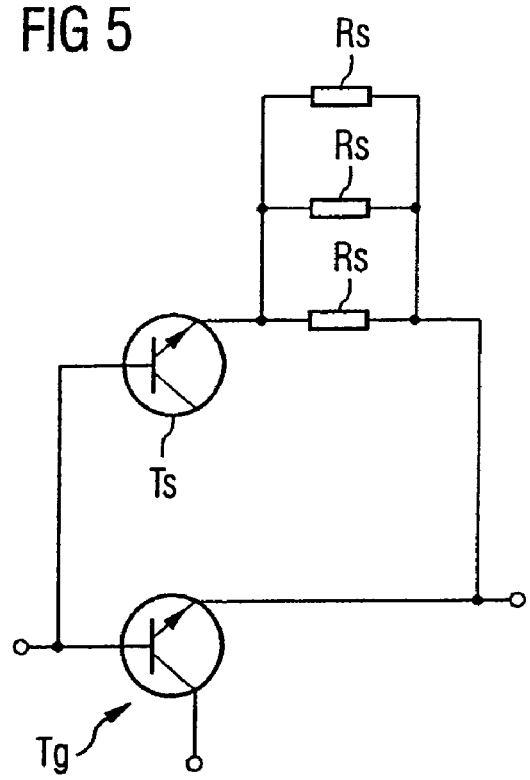
FIG. 5 illustrates a circuit diagram for a current sensor made of a sense transistor and a sense resistor lying in the source line of the sense transistor.

In the exemplary embodiment of FIG. 3, a current sense transistor Ts is provided, in the source line of which the individual current sense resistors Rs are in parallel with one another. In this case, the three current sense resistors Rs are in parallel with one another in the source line of the current sense transistor Ts, which, for its part, is connected in parallel with the gate-source junction of the power transistor Tg made of the three transistor cells T1, T2 and T3 which forms the power semiconductor component. FIG. 5 shows the corresponding circuit for the current sense resistors Rs in the source line of the current sense transistor Ts, which, for its part, is connected to the power transistor Tg.

Now that the current sensor has initially been explained in more detail, the temperature sensor will be discussed below.

With the current sensor and, if appropriate, a voltage sensor, the power semiconductor component is essentially safeguarded in principle at low and medium temperatures. However, if the temperature of the power semiconductor component rises further, then a temperature sensor has to be activated. The power loss rises greatly during fast processes such as, for example, during an overload as a result of a short circuit at an output stage. A large temperature gradient that then occurs from the region of the center of the power semiconductor component to the edge thereof makes it impossible in these situations to reliably detect this critical overtemperature by means of only one temperature sensor which is arranged outside the surface of the power semiconductor component or outside the output stage area.

According to the invention, therefore, a temperature sensor Tt is additionally inserted between two further cells, between the transistor cell T2 and the transistor cell T3 in the exemplary embodiment of FIG. 3. In this case, said temperature sensor Tt may comprise a plurality of stages Tt1, Tt2, Tt3. It goes without saying that it is possible in this case also to provide more than three stages or alternatively only one or two stages. Three stages have been chosen for illustration purposes in the exemplary embodiment of FIG. 3.

The temperature sensor stage Tt1 is preferably located in the center of the line DE, that is to say in the center of the cross-sectional area between the two transistor cells T2 and T3. The temperature sensor stage Tt1 can thus detect the dynamic peak temperature that occurs in the center of the cross-sectional area of the power semiconductor component.

The further temperature sensor stages Tt2 and Tt3 are located further toward the edge of the power semiconductor component proceeding from the central temperature sensor stage Tt1. It is thus possible, with the series of temperature sensor stages Tt1, Tt2, . . . , Ttn, to construct a staggered temperature protection circuit which can ascertain the temperature gradient internally within the power semiconductor component, so that overall a thermal protection arrangement with "prewarning" arises which can turn off the power semiconductor component by means of the drive circuit when specific temperature gradients or high peak temperatures occur.

The areas of the transistor cells T1, T2, T3 which adjoin the current sensor Ts or the temperature sensor Tt should be chosen such that the temperature gradient that occurs toward the center of the transistor cells remains sufficiently small.

In the case of a two-cell embodiment, the cell T1, by way of example, may be omitted. A current sense transistor Ts' then lies in the remaining space between the second cell T2 and the third cell T3. In the case of an embodiment with a higher number of cells, the current sense transistor may for example lie between the first cell and the second cell, while the temperature sensor is provided between the third cell and the fourth cell.

Figure 4:
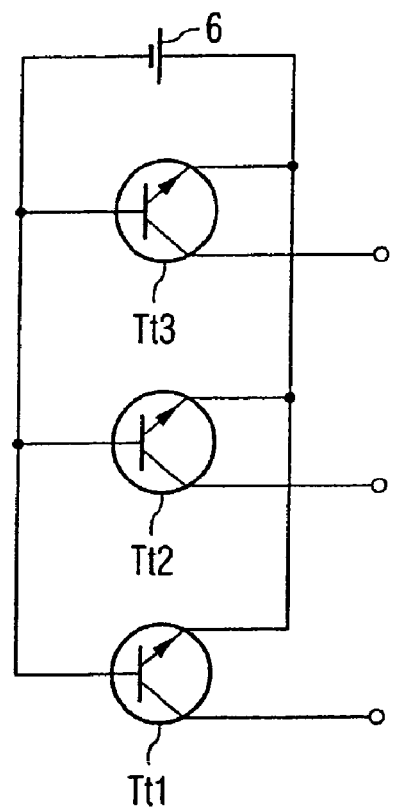
FIG. 4 illustrates a circuit diagram for a temperature sensor in the case of the protection arrangement according to the invention.

FIG. 4 illustrates how the temperature sensor stages Tt1, Tt2 and Tt3 of the exemplary embodiment of FIG. 3 are connected up to one another. In this example, the temperature sensor stages Tt1, Tt2 and Tt3 in each case comprise npn transistors whose base-emitter junction is biased by means of a constant-voltage source 6. The transistors are connected in parallel in each case at their base and emitter terminals. It is thus possible to use the respective collector current for determining the temperature prevailing at the location of the associated transistor. Instead of npn transistors, it is also possible, of course, to use pnp transistors or field effect transistors.

If, in the exemplary embodiment of FIG. 3, the power loss is increased in the transistor cells T1, T2 and T3, then the transistor of the temperature sensor stage Tt1 is the first to reach a predetermined current level, as a result of which a temperature prewarning is emitted. If the power loss rises further, gradually the transistors of the stages Tt2 and Tt3 located at "cooler" locations, from the center toward the edge of the chip of the power semiconductor component, will reach the current level.

In the simplest case, it is possible, of course, to position only one stage for the temperature sensor for overtemperature turn-off or regulation in the center of the chip, that is to say at the location of the stage Tt1 and to dispense with the stages Tt2 and Tt3.

The bias voltage for the constant-current source 6 may advantageously be derived from a voltage present at the power semiconductor component or the associated integrated circuit.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A power semiconductor component comprising a protection arrangement, comprising:
   at least a first cell and a second cell;
   a current sensor made of a current sense transistor, the sense transistor provided in an interspace between the first cell and the second cell, the first cell being adjacent to the second cell and separated therefrom by the interspace, wherein a temperature coefficient of the current sensor is directly influenced by a peak chip temperature of the first and second cells;
   a sense resistor device lying in the source line of the current sense transistor, the sense resistor device having at least one sense resistor arranged directly above one of the first and second cells; and
   the temperature sensor arranged either in the interspace between the first cell and the second cell or in an interspace between the second cell and a third cell.

2. The power semiconductor component as claimed in claim 1, wherein the temperature sensor comprises a plurality of stages which are in each case fitted at locations having different temperatures.

3. The power semiconductor component as claimed in one of claims 1, wherein the sense resistor has a positive temperature coefficient.

4. The power semiconductor component as claimed in claim 1, wherein the temperature sensor is formed from an npn transistor or a pnp transistor, which forms a stage of the temperature sensor.

5. The power semiconductor component as claimed in claim 4, wherein a first stage of the temperature sensor is provided at a location of greatest heating of the power semiconductor component.

6. The power semiconductor component as claimed in claim 1, wherein the power semiconductor component is a power transistor.

7. The power semiconductor component as claimed in claim 5, wherein the individual stages of the temperature sensor form a temperature prewarning system.

8. A power semiconductor component comprising a protection arrangement, comprising:
- at least a first cell and a second cell;
- a current sensor made of a current sense transistor, the current sense transistor provided in an interspace between a first cell and a second cell, the first cell being adjacent to the second cell and separated therefrom by the interspace, wherein a temperature coefficient of the current sensor is directly influenced by a peak chip temperature of the first and second cells;
- a sense resistor device lying in the source line of the current sense transistor, the sense resistor device having at least one sense resistor arranged directly above one of the first and second cells; and
- a temperature sensor arranged either in the interspace between the first cell and the second cell or in an interspace between the second cell and a third cell, and wherein the temperature sensor is formed from at least one npn transistor or at least one pnp transistor, where each transistor forms a stage of the temperature sensor; and
- wherein the transistors of the temperature sensor are biased at their base-emitter junction by means of a constant-voltage source and are connected in parallel on their base side and on their emitter side.

9. The power semiconductor component as claimed in claim 8, wherein the sense resistor is realized in a metallization plane.

10. The power semiconductor component as claimed in claim 8, wherein the temperature sensor and the sense transistor are accommodated in the same interspace between the first cell and the second cell.

11. The power semiconductor component as claimed in claim 10, wherein the temperature sensor and the sense transistor in each case extend approximately over half the extent of the interspace.

12. A power semiconductor component comprising a protection arrangement, comprising:
- at least a first cell and a second cell;
- a current sensor made of a current sense transistor, the current sense transistor provided in an interspace between the first cell and the second cell, the first cell being adjacent to the second cell and separated therefrom by the interspace, wherein a temperature coefficient of the current sensor is directly influenced by a peak chip temperature of the first and second cells;
- a sense resistor device lying in the source line of the current sense transistor, the sense resistor device having at least one sense resistor arranged directly above one of the first and second cells; and
- a temperature sensor arranged either in the interspace between the first cell and the second cell or in an interspace between the second cell and a third cell; and
- wherein the temperature sensor comprises a plurality of stages which are in each case arranged at locations having different temperatures.

13. The power semiconductor component as claimed in claim 12, wherein the sense resistor has a positive temperature coefficient.

14. The power semiconductor component as claimed in claim 13, wherein the temperature sensor is formed from an npn transistor or a pnp transistor, which forms a stage of the temperature sensor.

15. The power semiconductor component as claimed in claim 14, wherein a first stage of the temperature sensor is provided at a location of greatest heating of the power semiconductor component.

16. A power semiconductor component comprising a protection arrangement, comprising:
- at least a first cell and a second cell;
- a current sensor made of a current sense transistor, the current sense transistor provided in an interspace between the first cell and the second cell, the first cell being adjacent to the second cell and separated therefrom by the interspace, wherein a temperature coefficient of the current sensor is directly influenced by a peak chip temperature of the first and second cells;
- a sense resistor device lying in the source line of the current sense transistor, the sense resistor device having at least one sense resistor arranged directly above one of the first and second cells; and
- means for sensing temperature arranged either in the interspace between the first cell and the second cell or in an interspace between the second cell and a third cell.

17. The power semiconductor component as claimed in claim 1, wherein the at least one sense resistor is fitted directly on the first cell.

18. The power semiconductor component as claimed in claim 8, wherein the at least one sense resistor is fitted directly on the first cell.

19. The power semiconductor component as claimed in claim 12, wherein the at least one sense resistor is fitted directly on the first cell.

20. The power semiconductor component as claimed in claim 16, wherein the at least one sense resistor is fitted directly on the first cell.

* * * * *